United States Patent
Kashiwagi et al.

(10) Patent No.: US 11,732,365 B2
(45) Date of Patent: Aug. 22, 2023

(54) COMPOSITION FOR REMOVING RUTHENIUM

(71) Applicant: Kanto Kagaku Kabushiki Kaisha, Tokyo (JP)

(72) Inventors: Itsuki Kashiwagi, Tokyo (JP); Takuo Ohwada, Tokyo (JP)

(73) Assignee: Kanto Kagaku Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/291,256

(22) PCT Filed: Nov. 13, 2019

(86) PCT No.: PCT/JP2019/044463
§ 371 (c)(1),
(2) Date: May 4, 2021

(87) PCT Pub. No.: WO2020/100924
PCT Pub. Date: May 22, 2020

(65) Prior Publication Data
US 2022/0002881 A1 Jan. 6, 2022

(30) Foreign Application Priority Data
Nov. 14, 2018 (JP) .................... 2018-214179

(51) Int. Cl.
C23F 1/30 (2006.01)
H01L 21/3213 (2006.01)

(52) U.S. Cl.
CPC .......... *C23F 1/30* (2013.01); *H01L 21/32134* (2013.01)

(58) Field of Classification Search
CPC ................ C23F 1/30; C23F 1/14; C23F 1/16
See application file for complete search history.

(56) References Cited

U.S. PATENT DOCUMENTS

| | | | |
|---|---|---|---|
| 10,090,247 B1 * | 10/2018 | Briggs | ............ H01L 21/76861 |
| 2001/0023701 A1 | 9/2001 | Aoki et al. | |
| 2002/0060202 A1 | 5/2002 | Fukunaga et al. | |
| 2005/0176603 A1 | 8/2005 | Hsu et al. | |
| 2008/0148649 A1 | 6/2008 | Liu | |

(Continued)

FOREIGN PATENT DOCUMENTS

| | | |
|---|---|---|
| JP | 2001240985 | 9/2001 |
| JP | 2002231676 | 8/2002 |

(Continued)

OTHER PUBLICATIONS

Wikipedia, "Room Temperature" via https://web.archive.org/web/20180422172656/https://en.wikipedia.org/wiki/Room_temperature; pp. 1-3 (Year: 2018).*

(Continued)

*Primary Examiner* — Binh X Tran
(74) *Attorney, Agent, or Firm* — McDonnell Boehnen Hulbert & Berghoff LLP

(57) ABSTRACT

The present invention addresses the problem of providing a remover composition which can sufficiently remove ruthenium (Ru) remaining on substrates and can be inhibited from evolving $RuO_4$ gas. The remover composition, which is for removing ruthenium remaining on substrates, has a pH at 25° C. of 8 or higher and includes one or more pH buffer ingredients.

3 Claims, 2 Drawing Sheets

(56) References Cited

U.S. PATENT DOCUMENTS

| | | | |
|---|---|---|---|
| 2009/0124173 A1 | 5/2009 | Li | |
| 2012/0256122 A1 | 10/2012 | Sato et al. | |
| 2016/0215170 A1* | 7/2016 | Tamada | C09G 1/02 |
| 2017/0222138 A1 | 8/2017 | Park et al. | |
| 2018/0230405 A1* | 8/2018 | Kneer | C11D 7/06 |
| 2018/0291309 A1* | 10/2018 | Frye | C11D 11/0047 |
| 2018/0323151 A1 | 11/2018 | Briggs et al. | |
| 2019/0300749 A1* | 10/2019 | Lin | C09K 3/1463 |
| 2020/0369918 A1* | 11/2020 | Kondo | H01L 21/7684 |
| 2021/0062115 A1 | 3/2021 | Shimoda et al. | |

FOREIGN PATENT DOCUMENTS

| | | |
|---|---|---|
| JP | 2006173454 | 6/2006 |
| JP | 2008280605 | 11/2008 |
| JP | 2009016854 | 1/2009 |
| JP | 2018121086 | 8/2018 |

OTHER PUBLICATIONS

Wikipedia, "Boric acid" via https://web.archive.org/web/20180118010936/https://en.wikipedia.org/wiki/Boric_acid; pp. 1-11 (Year: 2018).*

Pubchem "Orthoperiodic acid" via https://pubchem.ncbi.nlm.nih.gov/compound/Orthoperiodic-acid ; pp. 1-25; (Year: 2022).*

Wikipedia, "Sodium" via https://web.archive.org/web/20180316125435/https://en.wikipedia.org/wiki/Sodium ; pp. 1-16 (Year: 2018).*

Wikipedia "Periodic acid" via https://web.archive.org/web/20190218203714/https://en.wikipedia.org/wiki/Periodic_acid ; pp. 1-5 (Year: 2018).*

Search Report received in Application No. 11202104777W dated Aug. 10, 2022.

Written Opinion received in Application No. 11202104777W dated Aug. 10, 2022.

* cited by examiner

[Fig.1]
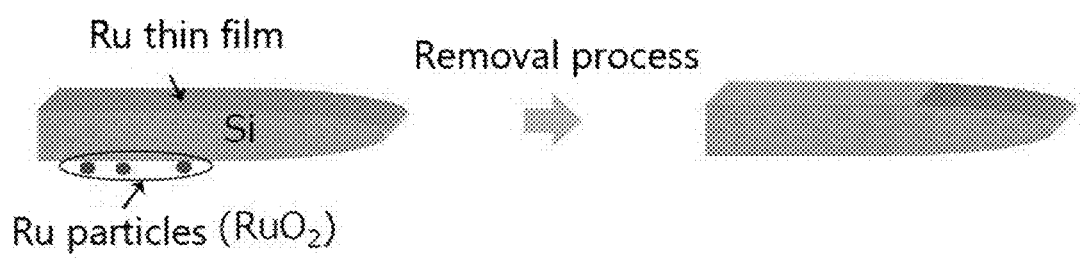
[Fig.2]
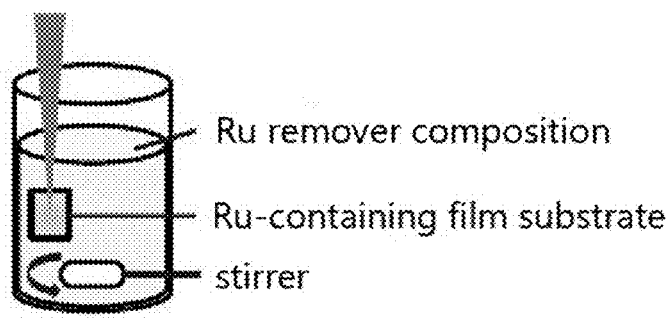

[Fig.3]
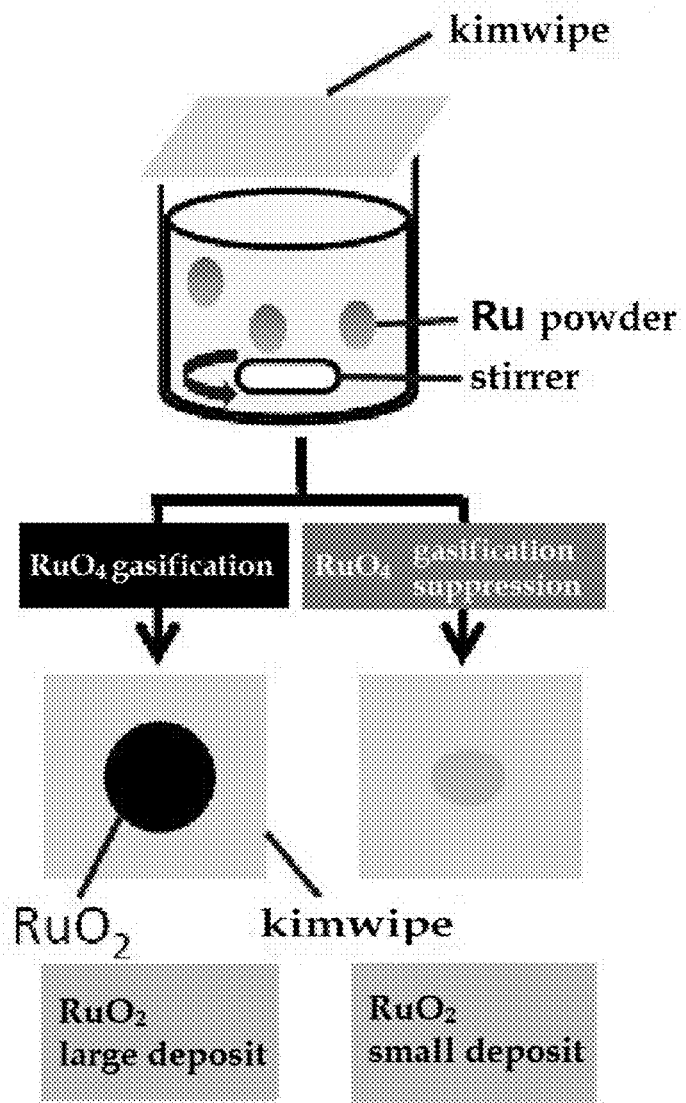
[Fig.4]
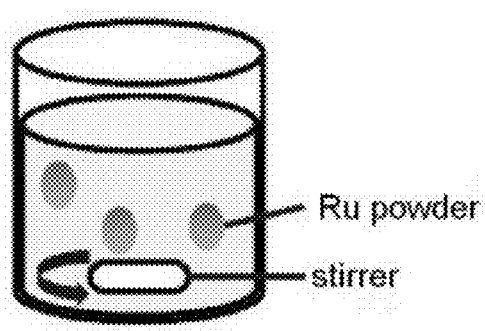

COMPOSITION FOR REMOVING RUTHENIUM

This application is a U.S. National Phase application under 35 U.S.C. § 371 of PCT/JP2019/044463, filed Nov. 13, 2019, which claims priority from and the benefit of Japanese Application No.: 2018-214179, filed on Nov. 14, 2018, the specifications of which are hereby incorporated by reference in their entireties into the instant application.

TECHNICAL FIELD

The present invention relates to a composition for removing ruthenium which remains on a substrate.

BACKGROUND ARTS

In recent years, ruthenium (Ru) is used in increasing cases as an electrode and wiring material of a semiconductor element, and further as a mask material of a photomask. Ru has advantages such as low resistance and little deterioration in performance in structure refinement and thinning. On the other hand, when Ru is deposited on a silicon substrate using Chemical Vapor Deposition (CVD) or Atomic Layer Deposition (ALD) methods, Ru-containing metals deposits on the end- and back-surfaces of the substrate. If these Ru-containing metals were left on the substrate, they may cause a significant adverse effect on the properties of the element. Therefore, there is a need to remove such Ru-containing metals (Patent Reference 1).

As compositions for removing Ru-containing metal, compositions containing either hypochlorous acid (Patent Reference 1), hydrobromic acid (Patent Reference 2), chlorine (Patent Reference 3), cerium nitrate salt (Patent References 4 and 5), or periodic acid (Patent References 6-8) have been investigated.

PRIOR ART REFERENCES

Patent References

| | |
|---|---|
| [Patent Reference 1] | JP A 2002-161381 |
| [Patent Reference 2] | WO 2011/074601 |
| [Patent Reference 3] | JP A 2008-280605 |
| [Patent Reference 4] | JP A 2001-234373 |
| [Patent Reference 5] | JP A 2002-231676 |
| [Patent Reference 6] | WO 2016/068183 |
| [Patent Reference 7] | JP A 2018-121086 |
| [Patent Reference 8] | JP A 2001-240985 |

SUMMARY OF THE INVENTION

Problems to be Solved by the Invention

The present inventors had faced a problem that when the oxidation of Ru in a remover composition proceeds, it would generate ruthenium tetroxide ($RuO_4$), a volatile toxic gas which causes a concern about influences on the operators health and surrounding environment. In this case, in order to scavenge $RuO_4$, it is necessary to take measures such as installing an activated charcoal filter in the exhaust air duct. Furthermore, when the gasified $RuO_4$ is brought into contact with an organic material, it will be reduced at once to generate black-colored ruthenium dioxide ($RuO_2$), causing a concern about reverse contamination of the substrate by being deposited onto the facility, etc.

Here, the present inventors have addressed a new object to provide a Ru remover composition that suppresses $RuO_4$ generation, is safe and requires no special facility, and have proceeded with the investigation. That is, an object of the present invention is to provide a remover composition that is capable of sufficiently removing Ru remaining on the substrate, and further of suppressing the generation of $RuO_4$ gas.

Means to Solve the Problems

The present inventors have made an intensive research to solve such problem and found that the generation of $RuO_4$ gas could be suppressed by setting the pH of the Ru remover composition at 25° C. to be equal to or above 8. Furthermore, the present inventors have found that, by adding one or more buffering ingredient(s) in said Ru remover composition, a sufficient etching rate could be maintained, and, furthermore, a long liquid life could be substantiated. The present inventors have further proceeded with the research to complete the invention.

Namely, the present invention relates to:

[1] A remover composition for ruthenium which remains on a substrate, wherein the pH of the composition at 25° C. is equal to or above 8, and the composition comprises one or more pH buffering ingredient(s).

[2] The remover composition according to [1], wherein the pH of the composition at 25° C. is equal to or above 8 and below 11.

[3] The remover composition according to [1] or [2] above, wherein the pH buffering ingredient(s) is(are) one or more selected from the group consisting of boric acid, borate, phosphoric acid, phosphate and bicarbonate.

[4] The remover composition according to any one of [1] to [3] above, comprising from 0.1 to 5.0 weight % of the pH buffering ingredient(s).

[5] The remover composition according to any one of [1] to [4] above, comprising an oxidizing agent that does not comprise a metal element, and comprising no oxidizing agent that comprises a metal element.

[6] The remover composition according to [5] above, wherein the oxidizing agent that does not comprise a metal element is an iodine compound.

[7] The remover composition according to [6] above, wherein the iodine compound is periodic acid or a salt thereof.

[8] The remover composition according to [7] above, wherein the periodic acid or a salt thereof is one or more selected from the group consisting of ortho-periodic acid, sodium ortho-periodate, meta-periodic acid and sodium meta-periodate.

[9] The remover composition according to any one of [6] to [8] above, comprising from 1.0 to 10.0 weight % of the iodine compound.

[10] The remover composition according to any one of [1] to [9] above, wherein the remover composition is an aqueous solution.

[11] A method of removing ruthenium which remains on a substrate using the remover composition according to any one of [1] to [10] above.

[12] A method of removing ruthenium which remains on a substrate while suppressing the generation of ruthenium tetroxide using a remover composition comprising one or more iodine compound(s) and having pH equal to or above 8 at 25° C.

[13] The method according to [12] above, wherein the remover composition further comprises one or more pH buffering ingredient(s).

Effects by the Invention

The remover composition of the present invention is alkaline and, in particular, has pH equal to or above 8 at 25° C. Because of this, it is capable of sufficiently removing Ru which remains on a substrate, while suppressing the generation of $RuO_4$ gas. This enhances safety and improves working environment without requiring any cost for additional facilities for scavenging the $RuO_4$ gas.

Furthermore, because the remover composition of the present invention comprises (a) buffering ingredient(s), it is capable of slowing the increase in pH associated with the removal of Ru by buffering activity, having a long liquid life while maintaining Ru-removal performance, thereby accomplishing the saving of resources.

Furthermore, in an embodiment in which an oxidizing agent that does not comprise a metal element is used, it is possible to substantiate an effective Ru removal without generating any metallic impurities, leaving no metallic impurities on the substrate.

BRIEF DESCRIPTION OF DRAWINGS

FIG. 1 A diagram showing the removal of Ru thin film and particles from a silicon substrate.

FIG. 2 A diagram showing the etching of an Ru-containing film substrate by a remover composition.

FIG. 3 A diagram showing a method of evaluating a remover composition for its $RuO_4$ gasification-suppressing performance.

FIG. 4 A diagram showing an aspect of stirring the remover composition in which Ru powder are dissolved.

MODE FOR CARRYING OUT THE INVENTION

Hereinbelow, the present invention will be described in detail based on suitable embodiments of the present invention.

The present invention relates to a remover composition for Ru-containing thin film and/or particles.

The remover composition of the present invention for Ru-containing thin film and/or particles has a pH equal to or above 8 at 25° C., and comprises one or more pH buffering ingredient(s).

The oxidizing agent used in the remover composition of the present invention is not particularly limited as long as it functions as an Ru-oxidizing agent, and include, for example, an oxidizing agent that does not comprise a metal element such as iodine compound, hypochlorous acid or hydrobromic acid, and an oxidizing agent that comprises a metal element such as cerium nitrate salt. The oxidizing agent can be used alone or in combination of two or more.

In order to avoid generating impurities originated from a metal element which remains on the substrate after removing Ru, the remover composition of the present invention preferably does not comprise an oxidizing agent that comprises a metal element, and comprises an oxidizing agent that does not comprise a metal element. A preferred oxidizing agent that does not comprise a metal element is an iodine compound.

The iodine compounds include a periodic acid or a salt thereof, an iodate or a salt thereof and the like. A periodic acid or a salt thereof is preferred.

The periodic acid or a salt thereof includes, for example, an ortho-periodic acid, a sodium ortho-periodate, meta-periodic acid and a sodium meta-periodate and the like, though the ortho-periodic acid is preferred considering that it does not generate a precipitate and maintains a preferable etching rate even at a high pH.

The content of an oxidizing agent that is used in the remover composition of the present invention is not particularly limited as long as it is capable of removing Ru.

When an iodine compound is used as the oxidizing agent, the content of the iodine compound is not particularly limited, though it is preferably between 1.0 and 10.0 weight %, particularly preferably between 3.5 and 7.0 weight %.

The pH buffering ingredient that is used in the remover composition of the present invention is not particularly limited as long as it is capable of maintaining and stabilizing the pre-adjusted pH (e.g., equal to or above pH 8). By the buffering activity of the pH buffering ingredient contained in the remover composition, both the reduction of the oxidizing agent by the process of etching and the pH increase accompanied with it can be suppressed, and the decrease in the etching rate can also be suppressed.

The pH buffering ingredients include boric acid, borate, phosphoric acid, phosphate, bicarbonate, ammonia, etc. In view of the buffering activity at a high pH, boric acid, borate and ammonium bicarbonate are preferred.

The pH buffering ingredient(s) can be used alone or in combination of two or more.

The content of the pH buffering ingredient is not particularly limited, though it is preferably between 0.1 and 5.0 weight %, particularly preferably between 1.0 and 2.0 weight %.

The remover composition of the present invention, in one embodiment, further comprises a pH-adjusting ingredient. The pH-adjusting ingredient is not particularly limited as long as it is capable of adjusting pH within a desired range. For example, it includes an inorganic alkaline and a quaternary ammonium hydroxide, etc. An inorganic alkaline and a quaternary ammonium hydroxide are preferred.

The inorganic alkaline and quaternary ammonium hydroxide include tetramethylammonium hydroxide (TMAH), tetraethylammonium hydroxide, tetrapropylammonium hydroxide, tetrabutylammonium hydroxide, ethyltrimethylammonium hydroxide, sodium hydroxide, potassium hydroxide, sodium metasilicate, potassium metasilicate, sodium orthosilicate and potassium orthosilicate. Preferably, it is TMAH.

The pH-adjusting ingredient can be used alone or in combination of two or more.

The content of the pH-adjusting ingredient is not particularly limited, though it is between 0.5 and 10.0 weight %, particularly preferably, between 4.0 and 7.0 weight %.

The remover composition of the present invention may, in one embodiment, comprise an optional ingredient other than the aforementioned ingredients as ling as it does not interfere with the removal of Ru-containing film and/or particles.

The condition of the remover composition of the present invention is is not particularly limited as long as it is in that condition capable of removing the Ru remaining on a substrate. However, in view of preventing a substance from remaining on the substrate after removing Ru, it is preferably a liquid with low viscosity such as, for example, an aqueous solution.

The pH of the remover composition of the present invention is equal to or above 8 at 25° C. When the pH is equal to or above 8, $RuO_4$ will be reduced to be an anion ($RuO_4^-$ or $RuO_4^{2-}$) which is capable of being dissolved in a solution. Therefore, the generation of $RuO_4$ gas can be suppressed. In view of suppressing the generation of $RuO_4$ gas and at the same time maintaining a practical etching rate, pH is preferably equal to or above 8 and below 11, particularly preferably equal to or above 9 and below 10.6.

Etching rate (nm/min) of a remover composition herein is defined as the amount of the film etched (nm) per processing time (minutes). The etching rate of a remover composition of the present invention is not particularly limited, though it is preferred to be in a range between 1 and 15 nm/min, is further preferred to be in a range between 7 and 12 nm/min, and particularly preferred to be in a range between 8 and 10 nm/min. When the etching rate is low, a sufficient etching to an Ru-containing film cannot be obtained, whereas when the etching rate is high, the substrate may be damaged.

The present invention, in one embodiment, relates to a method of removing Ru which remains on a substrate using a remover composition, wherein the pH of the composition at 25° C. is equal to or above 8, and the composition comprises one or more pH buffering ingredient(s).

The temperature of the remover composition in the removing method is not particularly limited, but includes, for example, from 20 to 60° C., though it is preferably from 25 to 50° C., particularly preferably 30 to 40° C. The generation of $RuO_4$ gas is promoted at a high temperature. The removing method of the present invention can be performed at around room temperature, and therefore it can suppress the generation of $RuO_4$ gas.

EXAMPLES

Next, the remover composition of the present invention will be described in further details with the following Examples, though the present invention is not to be limited thereto.

[Test Example 1] Evaluation of Ru Etching Rate (Method of Evaluating Etching Rate to a Ru-Containing Film)

An Ru-containing film substrate of 1 cm×1 cm in size was obtained in which, on a silicon substrate, a 1.5 nm titanium nitride film (blue) was deposited, and further a 10 nm Ru film (silver) 10 nm was deposited. The Ru-containing film substrate was immersed in 50 mL of a remover composition having any one of the compositions of Tables 1 and 2, stirred at 30° C. at a stirring speed of approximately 200 rpm for etching (FIG. 2). The disappearance of the Ru-containing film was confirmed by visual observation, the time from the start to the completion of etching (the just-etching time) was measured, and the etching rate (E.R.) was calculated. The etched Ru-containing film substrate was rinsed using ultra-pure water for 30 seconds, and dried under nitrogen gas. The results are shown in Tables 1 and 2.

TABLE 1

|  | Periodic Acid | | TMAH | | Boric Acid | | Water | | pH | E.R. (nm/min.) |
|---|---|---|---|---|---|---|---|---|---|---|
|  | wt % | M | wt % | M | wt % | M | wt % | M | | |
| Example 1 | 3.36 | 0.15 | 2.33 | 0.261 | — | — | balance | | 8.2 | 24 |
| Example 2 | 3.36 | 0.15 | 2.43 | 0.267 | — | — | balance | | 8.4 | 17.1 |
| Example 3 | 3.36 | 0.15 | 2.49 | 0.273 | — | — | balance | | 8.6 | 13.3 |
| Example 4 | 3.36 | 0.15 | 2.55 | 0.280 | — | — | balance | | 8.8 | 12 |
| Example 5 | 3.36 | 0.15 | 2.61 | 0.286 | — | — | balance | | 9 | 9.23 |
| Example 6 | 3.36 | 0.15 | 3.52 | 0.386 | 1.86 | 0.3 | balance | | 9 | 8.57 |
| Example 7 | 6.84 | 0.3 | 5.85 | 0.642 | 1.86 | 0.3 | balance | | 8.8 | 13.3 |
| Example 8 | 6.84 | 0.3 | 6.02 | 0.660 | 1.24 | 0.2 | balance | | 9.2 | 10 |
| Example 9 | 6.84 | 0.3 | 6.34 | 0.695 | 1.86 | 0.3 | balance | | 9.4 | 8 |
| Example 10 | 9.11 | 0.4 | 8 | 0.877 | 1.24 | 0.2 | balance | | 9.6 | 7 |
| Example 11 | 5.13 | 0.225 | 4.8 | 0.526 | 1.54 | 0.25 | balance | | 9.1 | 8 |
| Example 12 | 4.56 | 0.2 | 4.51 | 0.495 | 1.54 | 0.25 | balance | | 9.1 | 7.5 |
| Example 13 | 9.11 | 0.4 | 8.89 | 0.975 | 1.54 | 0.25 | balance | | 10.4 | 1.67 |
| Example 14 | 5.13 | 0.225 | 5.57 | 0.611 | 1.54 | 0.25 | balance | | 10 | 1.54 |

TABLE 2

|  | Periodic Acid | | TMAH | | Boric Acid | | Water | | pH | E.R. (nm/min.) |
|---|---|---|---|---|---|---|---|---|---|---|
|  | wt % | M | wt % | M | wt % | M | wt % | M | | |
| Example 15 | 9.11 | 0.4 | 9.108 | 0.999 | 1.18 | 0.15 | balance | | 10.4 | 1.33 |
| Example 16 | 9.11 | 0.4 | 8.04 | 0.882 | 1.18 | 0.15 | balance | | 9.62 | 5.45 |

From Examples 1 to 5 and 7 to 9 in Table 1, a tendency was recognized that the more the pH increases, the more the etching rate decreases. Also, from Example 8, 11 and 12, it became clear that the etching rate decreases along with the decrease in periodic acid content even if the pH is at a similar level. Moreover, from Examples 5 and 6, it became clear that the etching rate of the remover composition that comprises boric acid (buffering ingredient) is lower than the etching rate of the remover composition that does not comprise boric acid even if the pH is at a similar level. From Examples 13, 15 and Examples 10 and 16, it became clear that the etching rate of the remover composition that comprises ammonium bicarbonate (buffering ingredient) is lower than the etching rate of the remover composition that comprises boric acid (buffering ingredient) even if the pH is at a similar level.

[Test Example 2] Evaluation of Surface Metal Concentration of Substrate after Etching Process (Method of Evaluating Surface Metal Concentration of Substrate after Etching Process)

A silicon substrate of 4 inches square was immersed in 2.4 L solution of hydrogen fluoride for 1 minute, then rinsed for 1 minute using ultrapure water. This was followed by 1 hour of SC-1 treatment. After the treatment, the substrate was rinsed for 30 seconds using ultrapure water, dried overnight in atmosphere to obtain the substrate for evaluation.

The substrate for evaluation was immersed in 1.0 L of a composition having either composition of Table 3 or 4, etched for 1 minute at 25° C. The etched substrate was rinsed for 30 seconds using ultrapure water, and died in atmosphere. The surface metal concentration of the dried substrate was measured using a total reflection X-ray fluorescence spectrometer (TXRF, Model Number 3800e, RIGAKU Corporation).

The surface metal concentration was evaluated based on the following criteria. The results are shown in Tables 3 and 4.

"◯": The surface metal concentration is equal to or less than 50 10 A/cm$^2$.

"Δ": The surface metal concentration is from 50 to 200 10 A/cm$^2$.

"X": The surface metal concentration is equal to or more than 200 10 A/cm$^2$.

TABLE 3

| | Ceric Ammonium Nitrate wt % | Nitric Acid wt % | Water wt % | Surface Metal Concentration 10 A/cm$^2$ |
|---|---|---|---|---|
| Example 13 | 20 | 15 | balance | 1195(X) |

TABLE 4

| | Ceric Ammonium Nitrate wt % | TMAH wt % | Boric Acid wt % | Water wt % | Surface Metal Concentration 10 A/cm$^2$ |
|---|---|---|---|---|---|
| Example 11 | 5.13 | 4.8 | 1.54 | balance | 12(◯) |

As shown in Tables 3 and 4, it was confirmed that the remover composition that comprises periodic acid is capable of reducing the surface metal concentration of the substrate after the etching process more than that the remover composition that comprises a metal (cerium) within the composition does.

[Test Example 3] Evaluation of RuO$_4$ Gasification-Suppressing Performance (Evaluation Principle of RuO$_4$ Gasification-Suppressing Performance)

Although RuO$_4$ gas is colorless, it will be reduced to black-colored RuO$_2$ when it comes into contact with an organic material. Therefore, it is possible to evaluate the extent of RuO$_4$ gas generation based on the amount of the black substance deposited on the organic material. Here, an example is shown where a paper wiper (Kimwipe® model number: S-200) was used as the organic material to evaluate the RuO$_4$ gasification-suppressing performance (FIG. 3).

(Method of Evaluating RuO$_4$ Gasification-Suppressing Performance)

To 50 mL remover composition having the composition of either Table 1 or 2, 2 mg of Ru powder having particle diameter of about 50 μm was added. The container was covered with a paper wiper (Kimwipe® model number: S-200) and stirred overnight at about 25° C. at a stirring rate of about 400 rpm. The amount of black substance (RuO$_2$) deposited on the paper wiper was observed by by visual inspection, and RuO$_4$ gasification-suppressing performance of the remover composition was evaluated based on the following criteria. The results are shown in Tables 5 and 6.

"⊙": No deposit indicated on the paper wiper.

"◯": Gray substance deposited on the paper wiper.

"Δ": Dark gray to thin substance deposited on the paper wiper.

"X": Black substance deposited on the paper wiper.

TABLE 5

| | Periodic Acid | | TMAH | | Boric Acid | | Water | | pH | E.R. (nm/min.) | $RuO_4$ Gasification Suppression |
|---|---|---|---|---|---|---|---|---|---|---|---|
| | wt % | M | wt % | M | wt % | M | wt % | M | | | |
| Example 1 | 3.36 | 0.15 | 2.33 | 0.261 | — | — | balance | | 8.2 | 24 | X |
| Example 2 | 3.36 | 0.15 | 2.43 | 0.267 | — | — | balance | | 8.4 | 17.1 | X |
| Example 3 | 3.36 | 0.15 | 2.49 | 0.273 | — | — | balance | | 8.6 | 13.3 | X |
| Example 4 | 3.36 | 0.15 | 2.55 | 0.280 | — | — | balance | | 8.8 | 12 | Δ |
| Example 5 | 3.36 | 0.15 | 2.61 | 0.286 | — | — | balance | | 9 | 9.23 | Δ |
| Example 7 | 6.84 | 0.3 | 5.85 | 0.642 | 1.86 | 0.3 | balance | | 8.8 | 13.3 | Δ |
| Example 8 | 6.84 | 0.3 | 6.02 | 0.660 | 1.24 | 0.2 | balance | | 9.2 | 10 | ○ |
| Example 9 | 6.84 | 0.3 | 6.34 | 0.695 | 1.86 | 0.3 | balance | | 9.4 | 8 | ○ |
| Example 10 | 9.11 | 0.4 | 8 | 0.877 | 1.24 | 0.2 | balance | | 9.6 | 7 | ○ |
| Example 11 | 5.13 | 0.225 | 4.8 | 0.526 | 1.54 | 0.25 | balance | | 9.1 | 8 | ○ |
| Example 12 | 4.56 | 0.2 | 4.51 | 0.495 | 1.54 | 0.25 | balance | | 9.1 | 7.5 | ○ |
| Example 13 | 9.11 | 0.4 | 8.89 | 0.975 | 1.54 | 0.25 | balance | | 10.4 | 1.67 | ⊚ |
| Example 14 | 5.13 | 0.225 | 5.57 | 0.611 | 1.54 | 0.25 | balance | | 10 | 1.54 | ⊚ |

TABLE 6

| | Periodic Acid | | TMAH | | Ammonium Bicarbonate | | Water | | pH | E.R. (nm/min.) | $RuO_4$ Gasification Suppression |
|---|---|---|---|---|---|---|---|---|---|---|---|
| | wt % | M | wt % | M | wt % | M | wt % | M | | | |
| Example 15 | 9.11 | 0.4 | 9.108 | 0.999 | 1.18 | 0.15 | balance | | 10.4 | 1.33 | ⊚ |
| Example 16 | 9.11 | 0.4 | 8.04 | 0.882 | 1.18 | 0.15 | balance | | 9.62 | 5.45 | ⊚ |

As shown in Table 5, it was suggested that, in a case of the remover composition that comprises boric acid (buffering ingredient), in order to sufficiently suppress the gasification of $RuO_4$, the remover composition needs to have a pH that is equal to or higher than 9.0, more preferably a pH that is equal to or higher than 10. From Table 6, it was suggested that, in a case of the remover composition that comprises ammonium bicarbonate (buffering ingredient), the remover composition needs to have a pH that is equal to or higher than 9.6. Moreover, from Examples 10 and 16, it was suggested that a remover composition that comprises ammonium bicarbonate (buffering ingredient) has a higher performance in suppressing $RuO_4$ gasification than a remover composition that comprises boric acid (buffering ingredient) even if their pH is at similar level.

[Test Example 4] Evaluating Liquid Life (Method of Evaluating Liquid Life)

To 50 mL remover composition having the composition of either Table 7 or 8, 2 mg of Ru powder having particle diameter of about 50 μm was added. The container was covered with a paper wiper (Kimwipe® model number: S-200) and stirred overnight at about 25° C. at a stirring rate of about 400 rpm (FIG. 4). The pH and the etching rate of the remover composition before and after the addition of the Ru powder were measured, and the liquid life of the remover composition was evaluated based on the following criteria. The results are shown in Tables 7 and 8.

"○": The change in pH is equal to or less than 0.2, and the decrease in E.R. is equal to or less than 2 nm/min.

"Δ": The change in pH is 0.2-0.3, and the decrease in E.R. is 2-3 nm/min.

"X": The change in pH is equal to or more than 0.3, and the decrease in E.R. is equal to or more than 3 nm/min.

In Tables 7 and 8, pH and etching rate indicate the values for the remover composition before adding Ru powder.

TABLE 7

| | Periodic Acid | | TMAH | | Boric Acid | | Water | | pH | E.R. (nm/min.) | Liquid Life |
|---|---|---|---|---|---|---|---|---|---|---|---|
| | wt % | M | wt % | M | wt % | M | wt % | M | | | |
| Example 11 | 5.13 | 0.225 | 4.8 | 0.526 | 1.54 | 0.25 | balance | | 9.1 | 8 | ○ |
| Example 14 | 5.13 | 0.225 | 4.09 | 0.449 | — | — | balance | | 9.1 | 8 | X |

TABLE 8

| | Periodic Acid | | TMAH | | Ammonium Bicarbonate | | Water | | pH | E.R. (nm/min.) | Liquid Life |
|---|---|---|---|---|---|---|---|---|---|---|---|
| | wt % | M | wt % | M | wt % | M | wt % | M | | | |
| Example 15 | 9.11 | 0.4 | 9.108 | 0.999 | 1.18 | 0.15 | balance | | 10.4 | 1.33 | ○ |

As shown in Table 7, it was confirmed that the remover composition that comprises boric acid (pH buffering ingredient) suppresses the changes in etching rate and pH after dissolving Ru. Moreover, from Table 8, it was confirmed that the remover composition that comprises ammonium bicarbonate (buffering ingredient) also suppresses the changes in etching rate and pH after dissolving Ru. These results confirmed that the pH buffering ingredient contributes to the improvement of liquid life of the remover composition.

The invention claimed is:

1. A method of removing ruthenium which remains on a substrate while suppressing the generation of ruthenium tetroxide using a remover composition comprising 1.0 to 2.0 weight % of one or more pH buffering ingredient(s) and 1.0 to 10.0 weight % of one or more iodine compound(s) selected from the group consisting of ortho-periodic acid, sodium ortho-periodate, meta-periodic acid and sodium meta-periodate and having pH equal to or above 8 at 25° C.

2. The method of claim 1, wherein the pH of the composition at 25° C. is equal to or above 8 and below 11.

3. The method of claim 1, wherein the remover composition is an aqueous solution.

* * * * *